(12) United States Patent
Teter

(10) Patent No.: US 6,294,849 B1
(45) Date of Patent: Sep. 25, 2001

(54) MAGNETOSTRICTIVE ACTUATOR WITH LOAD COMPENSATING OPERATIONAL MODIFICATION

(75) Inventor: Joseph P. Teter, Mt. Airy, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/644,657

(22) Filed: Aug. 24, 2000

(51) Int. Cl.$^7$ .......................... H01L 41/06; H01L 41/12; H02N 02/00; H02K 07/06
(52) U.S. Cl. .................................. 310/26; 310/83
(58) Field of Search .................... 310/83, 26, 15, 310/80, 75 R, 66; 318/686, 118; 367/156, 168; 331/157; 333/148, 201; 335/215

(56) References Cited

U.S. PATENT DOCUMENTS

| | | | | |
|---|---|---|---|---|
| 2,096,906 | * | 10/1937 | Lilja | 310/99 |
| 3,523,204 | * | 8/1970 | Rand | 310/103 |
| 3,814,962 | * | 6/1974 | Baermann | 310/103 |
| 5,451,821 | | 9/1995 | Teter et al. | 310/26 |

* cited by examiner

Primary Examiner—Nestor Ramirez
Assistant Examiner—Guillermo Perez
(74) Attorney, Agent, or Firm—Jacob Shuster

(57) ABSTRACT

A magnetostrictive actuator has an active rod deformed under exposure to magnetic bias of a magnetic field that is modified in accordance with variable external input loading transferred through gearing to rotationally displace a segmented magnetic shell relative to a fixed segmented magnetic shell within which the magnetic field is established.

6 Claims, 1 Drawing Sheet

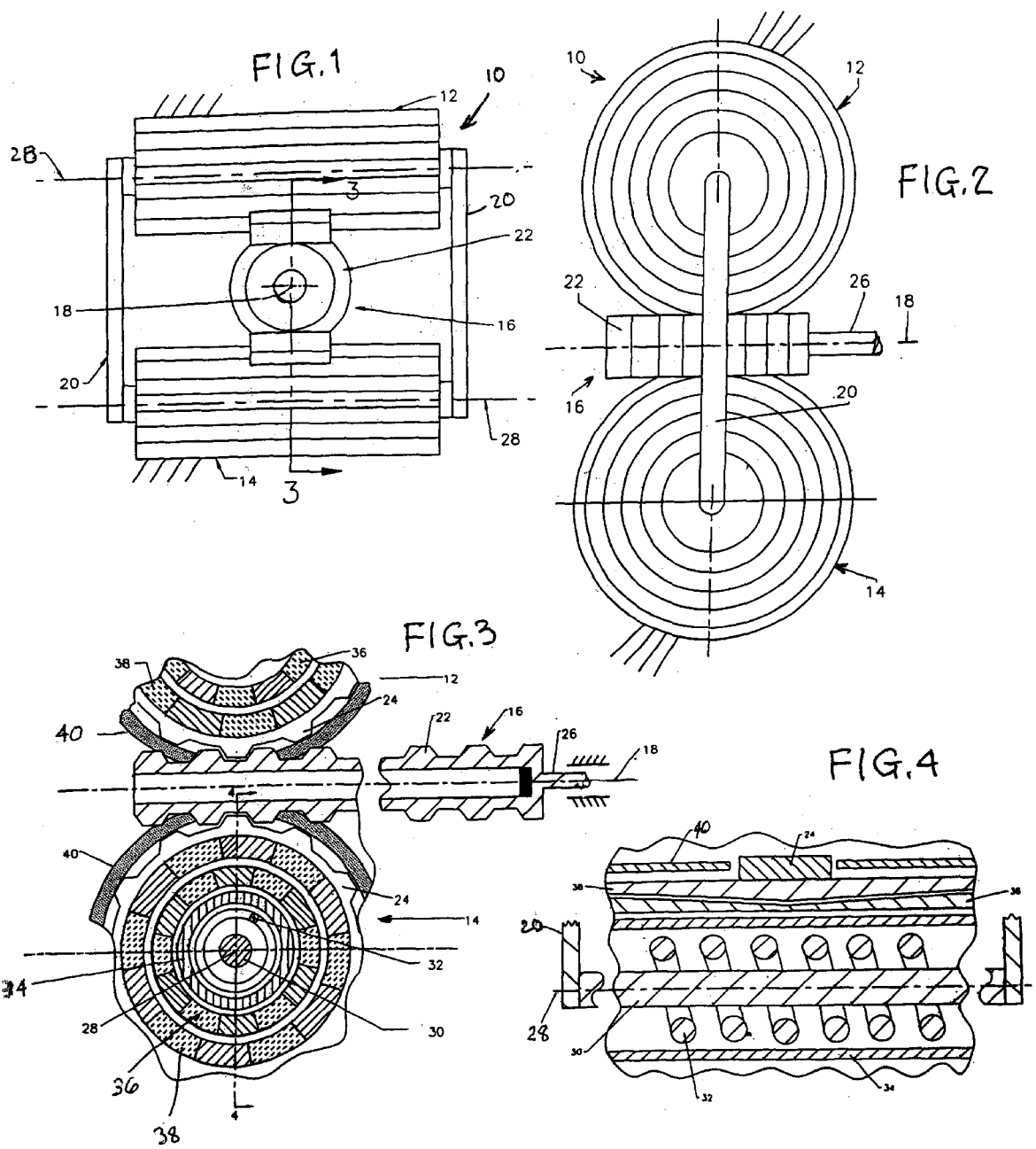

MAGNETOSTRICTIVE ACTUATOR WITH LOAD COMPENSATING OPERATIONAL MODIFICATION

The present invention relates generally to the modification of operational characteristics associated with magnetostrictive actuators.

BACKGROUND OF THE INVENTION

Magnetostrictive actuators are generally known in the art, as disclosed for example in U.S. Pat. No. 5,451,821 to Teter et al. Such an actuator having a magnetostrictive rod as its active component is provided with magnetic field bias adjustment to optimize operation for single fixed external loads. It is therefore an important object of the present invention to provide the foregoing type of magnetostrictive actuator with means for optimizing the operating characteristics thereof in accordance with ambient variation of loading, such as external pressures applied for example to sonar transducer types of actuators associated with marine vessels during travel through pressure exerting water between shallow and deep water depths.

SUMMARY OF THE INVENTION

In accordance with the present invention, two cylindrical shells having magnetic segments concentrically positioned about the magnetostrictively active rod of the actuator are utilized to modify the adjustable bias of a magnetic field imposed on the active rod by a surrounding magnetic flux generating coil positioned within a solid cylindrical shell through which the magnetostrictively active rod extends. The radially outer segmented shell has rotary gearing fixed thereto for angular displacement of the outer shell segments relative to the segments of the other radially inner shell that is held fixed together with a third segmented, flux return shell within which the other shells are concentrically positioned about the active magnetostrictive rod. Angular displacement of the shell to which the rotary gearing is fixed, is effected through linear drive gearing on a transfer rod axially displaced in response to changes in external pressure loading to correspondingly control modification of the flux bias of the magnetic field to which the active magnetostrictive rod is exposed.

BRIEF DESCRIPTION OF DRAWING FIGURES

A more complete appreciation of the invention and many of its attendant advantages will be readily appreciated as the same becomes better understood by reference to the following detailed description when considered in connection with the accompanying drawing herein:

FIG. 1 is a side elevation view of a magnetostrictive actuator, arranged in accordance with embodiment of the present invention;

FIG. 2 is a front elevation view of the actuator shown in FIG. 1;

FIG. 3 is a partial section view, taken substantially through a plane indicated by section line 3—3 in FIG. 1; and FIG. 4 is a partial section view, taken substantially through a plane indicated by section line 4—4 in FIG. 3.

DETAILED DESCRIPTION OF PREFERRED EMBODIMENT

Referring now to the drawing in detail, FIGS. 1 and 2 illustrate a magnetostrictive actuator according to one embodiment, generally referred to by reference numeral 10. Such actuator 10 includes a pair of cylindrical magnetic shell assemblies 12 and 14 of similar construction positioned in parallel spaced relation to each other by driving engagement with a common linear drive 16 having a central axis 18 extending perpendicular to the cylindrical shell assemblies 12 and 14, interconnected at opposite axial ends thereof by a pair of magnetic flux return path elements 20.

As shown in FIG. 3, the linear drive 16 includes a linear gear 22 enmeshed with rotary gearing 24 projecting radially from the cylindrical shell assemblies 12 and 14. A transfer rod 26 extends from one axial end of the linear gear 22 for guided axial movement along the axis 18. The rotary gears 24 enmeshed with the linear gear 22 are rotatable about parallel spaced axes 28 respectively associated with the cylindrical magnetic shell assemblies 12 and 14 as shown in FIG. 1.

With continued reference to FIGS. 3 and 4, the axis 28 of shell assembly 12 or 14 extends through an active magnetostrictive component thereof such as a Terfenol-D rod 30 to which the flux return path elements 20 are connected at opposite axial ends thereof. Each rod 30 is surrounded by a magnetic field coil 32 for generating variable magnetic flux within a solid longitudinal shell 34 constituting a permanent magnet positioned in close radially spaced relation to a fixed inner magnetic shell formed thereabout from magnetic segments 36 which are spaced from each other by non-magnetic fillers. An outer rotatable cylindrical shell formed from magnetic segments 38 spaced by non-magnetic fillers is positioned in close radially spaced relation to the inner magnetic segmented shell for rotational displacement of magnetic segments 38 relative to the fixed magnetic segments 36. The rotary gear 24 is fixed to the outer magnetic segmented shell for meshing engagement with the linear gear 22. Finally, a flux return shell formed from high permeability segments 40 cylindrically encloses the rotary gearing 24 projecting through an opening therein for meshing engagement with the linear gear 22.

The foregoing described embodiment of the magnetostrictive actuator 10 when utilized as a sonar transducer subject to internal pressure within a marine vessel, is activated under control of external water pressure loading varied during vessel travel between shallow water depths and deeper depths. Such pressures are exerted on the transfer rod 26 by some diaphragm type of pressure transduction device connected thereto. Thus, as the external pressure varies relative to the internal pressure, linear movement imparted to the rod 26 transfers rotary motion through the gearing 22 and 24 to the outer rotatable magnetic shell formed by the segments 38 which are thereby displaced relative to the magnetic segments 36 of the fixed inner segmented magnetic shell so as to modify the bias magnetic field established through field coil 32 to which the Terfenol-D rod 30 is exposed for magnetostrictive deformation. Such magnetic field bias modification is also affected by the aforesaid displacement of the magnetic segments 38 relative to the segments 40 of the flux return shell so as to correspondingly vary the net magnetic field modification induced by axial linear displacement of the transfer rod 26 involving a change in magnetic flux to which the Terfenol-D rod 30 is exposed so as to accommodate ambient pressure changes by correspondingly changing the operating characteristics of the actuator 10 for optimization thereof when acting as a sonar transducer. The actuator 10 can also be associated with input loadings other than pressures, involving electric motor control or by an internal electronic circuit having external pressure as the input according to other installational embodiments.

FIG. 4 shows the magnetic shells respectively formed by the segments 36 and 38 as hereinbefore described as having a continuously varying cross-section so as to produce an effective non-uniform magnetic flux for a desired magnetic field profile when subject to uniform magnetization by the magnetic field coil 32. Overall efficiency is also enhanced by use of opposite bias and current applied to the magnetic field coils 32 respectively associated with the magnetic shell assemblies 12 and 14, by use of an appropriate magnetic flux return circuit established through the magnetic return path elements 20.

Obviously, other modifications and variations of the present invention may be possible in light of the foregoing teachings. It is therefore to be understood that within the scope of the appended claims the invention may be practiced otherwise than as specifically described.

What is claimed is:

1. In combination with a magnetostrictive actuator having an active component, magnetic means for establishing a magnetic bias to which the active component is exposed and electromagnetic coil means for generating a magnetic field within which the active component is positioned to exert said magnetic bias thereon, the improvement residing in: magnetic shell means mounted in surrounding relation to the active component for affecting the magnetic bias exerted thereon; and load responsive means operatively engageable with the magnetic shell means for modifying the magnetic bias exerted on the active component.

2. The combination as defined in claim 1, wherein said magnetic shell means includes a pair of magnetic shells mounted in coaxial relation to the active component and respectively formed from spaced magnetic segments; one of said magnetic shells being rotationally fixed relative to the active component; and load transfer means for rotational displacement of the other of the magnetic shells under control of the load responsive means.

3. The combination as defined in claim 2, wherein said load responsive means is an axially displaceable rod connected to the load transfer means.

4. The combination as defined in claim 3, wherein said load transfer means includes linear gearing enmeshed with rotational gearing fixed to the other of the magnetic shells.

5. The combination as defined in claim 2, wherein said load transfer means includes linear gearing physically enmeshed with rotational gearing fixed to the other of the magnetic shells.

6. The combination as defined in claim 1, wherein said load responsive means is an axially displaceable rod.

* * * * *